US 11,114,982 B2

(12) United States Patent
Tanaka et al.

(10) Patent No.: US 11,114,982 B2
(45) Date of Patent: Sep. 7, 2021

(54) POWER AMPLIFIER CIRCUIT

(71) Applicant: Murata Manufacturing Co., Ltd., Kyoto (JP)

(72) Inventors: Satoshi Tanaka, Kyoto (JP); Kazuo Watanabe, Kyoto (JP); Satoshi Arayashiki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/821,282

(22) Filed: Mar. 17, 2020

(65) Prior Publication Data
US 2020/0304073 A1 Sep. 24, 2020

(30) Foreign Application Priority Data

Mar. 20, 2019 (JP) .............................. JP2019-053646

(51) Int. Cl.
*H03F 1/30* (2006.01)
*H03F 1/02* (2006.01)
*H03F 3/213* (2006.01)

(52) U.S. Cl.
CPC ........... *H03F 1/0216* (2013.01); *H03F 3/213* (2013.01); *H03F 2200/102* (2013.01); *H03F 2200/222* (2013.01); *H03F 2200/451* (2013.01)

(58) Field of Classification Search
CPC ....................................................... H03F 1/30
(Continued)

(56) References Cited

U.S. PATENT DOCUMENTS 7,332,968 B2* 2/2008 Luo ....................... H03F 1/0261
330/296
7,688,133 B2* 3/2010 Yamamoto ............ H03F 1/0261
330/51
(Continued)

FOREIGN PATENT DOCUMENTS

| CN | 106330109 A | 1/2017 |
| JP | 2005-33650 A | 2/2005 |

(Continued)

OTHER PUBLICATIONS

Montoro et al., "Slew-Rate Limited Envelopes for Driving Envelope Tracking Amplifiers", 2011 IEEE. IEEE Radio and Wireless Symposium, Phoenix, AZ, USA, Jan. 2011. Conference on Power Amplifiers for Wireless and Radio Applications, pp. 17-20. U.S.A.

*Primary Examiner* — Henry Choe
(74) *Attorney, Agent, or Firm* — Pearne & Gordon LLP

(57) ABSTRACT

A power amplifier circuit includes an amplifier transistor having a first terminal supplied with a power supply voltage that changes in accordance with an amplitude level of an input signal, and a second terminal supplied with the input signal and a bias current, an amplified signal obtained by amplifying the input signal being outputted from the first terminal, a bias circuit that outputs the bias current from an output terminal thereof in accordance with a reference current supplied to an input terminal thereof, and a regulation circuit that generates a regulation current for regulating the bias current in accordance with a change in the power supply voltage. The regulation current increases with an increase in the power supply voltage, and decreases with a decrease in the power supply voltage. The regulation circuit extracts the regulation current from at least one of the reference current or the bias current.

20 Claims, 10 Drawing Sheets

(58) Field of Classification Search
USPC .................................................. 330/296, 285
See application file for complete search history.

(56) References Cited

U.S. PATENT DOCUMENTS

| | | | |
|---|---|---|---|
| 9,013,238 B2* | 4/2015 | Ding | ........................ H03F 3/191 |
| | | | 330/289 |
| 2004/0150479 A1* | 8/2004 | Abe | ....................... H03F 1/0211 |
| | | | 330/296 |
| 2005/0007200 A1 | 1/2005 | Inoue et al. | |
| 2006/0033576 A1* | 2/2006 | Luo | ........................... H03F 3/04 |
| | | | 330/296 |
| 2011/0043284 A1 | 2/2011 | Zhao et al. | |
| 2015/0200660 A1 | 7/2015 | Masuda | |
| 2016/0322944 A1 | 11/2016 | Hase | |
| 2018/0006608 A1 | 1/2018 | Tanaka et al. | |
| 2018/0062579 A1 | 3/2018 | Tanaka et al. | |
| 2018/0152143 A1 | 5/2018 | Tanaka et al. | |
| 2018/0248524 A1 | 8/2018 | Honda et al. | |
| 2018/0316315 A1 | 11/2018 | Torii et al. | |

FOREIGN PATENT DOCUMENTS

| | | |
|---|---|---|
| JP | 2010-21869 A | 1/2010 |
| JP | 2013-502847 A | 1/2013 |
| JP | 2013-211830 A | 10/2013 |
| JP | 2015-133660 A | 7/2015 |
| JP | 2016-213557 A | 12/2016 |
| JP | 2018-007029 A | 1/2018 |
| JP | 2018-33028 A | 3/2018 |
| JP | 2018-85689 A | 5/2018 |
| JP | 2018-142833 A | 9/2018 |
| WO | 2017/098578 A1 | 6/2017 |

* cited by examiner

POWER AMPLIFIER CIRCUIT

This application claims priority from Japanese Patent Application No. 2019-053646 filed on Mar. 20, 2019. The content of this application is incorporated herein by reference in its entirety.

BACKGROUND OF THE DISCLOSURE

1. Field of the Disclosure

The present disclosure relates to a power amplifier circuit.

2. Description of the Related Art

Mobile communication devices such as mobile phones include power amplifier circuits having transistors to amplify power of transmission signals. A known technique for improving the power efficiency of a power amplifier circuit without compromising its linearity is envelope tracking (ET) for changing a power supply voltage in accordance with the amplitude level of a transmission signal. In an ET system, a power supply voltage is changed so as to follow the envelope of a transmission signal, thereby allowing a transistor to operate with the minimum power with which it is possible to guarantee its linearity.

With the recent increase in the modulation band width of transmission signals, some transmission signals may have a modulation band width of 100 MHz or more, for example. When the ET system is to be applied to such a transmission signal having a wide modulation band width, it may be difficult to generate a power supply voltage that is made to completely follow the envelope of the transmission signal. To address this difficulty, for example, a technique for changing a power supply voltage at a slower rate than in the existing ET system such that the power supply voltage is not made to completely follow the envelope of the transmission signal is disclosed by Gabriel Montoro, Pere L. Gilabert, Pedro Vizarreta, and Eduard Bertran in "Slew-Rate Limited Envelopes for Driving Envelope Tracking Amplifiers", 2011 IEEE Topical Conference on Power Amplifiers for Wireless and Radio Applications, pp. 17-20 (hereinafter referred to as "Non-Patent Document").

However, in the configuration disclosed in Non-Patent Document above, since a power supply voltage is not made to completely follow the envelope of a transmission signal, a power supply voltage with different levels may be generated even for the same level of output powers of a transmission signal. The power amplification gain differs depending on the level of the power supply voltage, and thus different levels of the power supply voltage may cause a large gain variation.

BRIEF SUMMARY OF THE DISCLOSURE

Accordingly, it is an object of the present disclosure to provide a power amplifier circuit with reduced gain variation and improved power efficiency.

According to preferred embodiments of the present disclosure, a power amplifier circuit includes an amplifier transistor having a first terminal and a second terminal, wherein a power supply voltage that changes in accordance with an amplitude level of an input signal is supplied to the first terminal, the input signal and a bias current are supplied to the second terminal, and an amplified signal obtained by amplifying the input signal is output from the first terminal; a bias circuit that outputs the bias current from an output terminal of the bias circuit in accordance with a reference current supplied to an input terminal of the bias circuit; and a regulation circuit that generates a regulation current for regulating the bias current in accordance with a change in the power supply voltage. The regulation current is a current that increases with an increase in the power supply voltage and decreases with a decrease in the power supply voltage. The regulation circuit extracts the regulation current from at least one of the reference current or the bias current.

According to preferred embodiments of the present disclosure, a power amplifier circuit includes a lower transistor having a first terminal, a second terminal, and a third terminal, wherein a first power supply voltage that changes in accordance with an amplitude level of an input signal is supplied to the first terminal, the input signal and a first bias current are supplied to the second terminal, and the third terminal is connected to ground; an intermediate capacitor; an upper transistor having a first terminal, a second terminal, and a third terminal, wherein a second power supply voltage that changes in accordance with the amplitude level of the input signal is supplied to the first terminal, an amplified signal obtained by amplifying the input signal is output from the first terminal, a second bias current is supplied to the second terminal, and the third terminal is connected to the first terminal of the lower transistor via the intermediate capacitor; an inductor that connects the third terminal of the upper transistor to ground; a first bias circuit that outputs the first bias current from an output terminal of the first bias circuit in accordance with a first reference current supplied to an input terminal of the first bias circuit; a second bias circuit that outputs the second bias current from an output terminal of the second bias circuit in accordance with a second reference current supplied to an input terminal of the second bias circuit; a first regulation circuit that generates a first regulation current for regulating the first bias current in accordance with a change in the first power supply voltage; a second regulation circuit that generates a second regulation current for regulating the second bias current in accordance with a change in the second power supply voltage; and an impedance adjustment circuit disposed between the second terminal of the upper transistor and the second bias circuit and configured to adjust an impedance seen from the second terminal of the upper transistor. The first regulation current is a current that increases with an increase in the first power supply voltage and decreases with a decrease in the first power supply voltage, and the second regulation current is a current that increases with an increase in the second power supply voltage and decreases with a decrease in the second power supply voltage. The first regulation circuit extracts the first regulation current from at least one of the first reference current or the first bias current, and the second regulation circuit extracts the second regulation current from at least one of the second reference current or the second bias current.

According to preferred embodiments of the present disclosure, it may be possible to provide a power amplifier circuit with reduced gain variation and improved power efficiency.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

The following describes embodiments of the present disclosure in detail with reference to the drawings. The same or substantially the same elements are denoted by the same numeral, and will not be repeatedly described.

Figure 1:
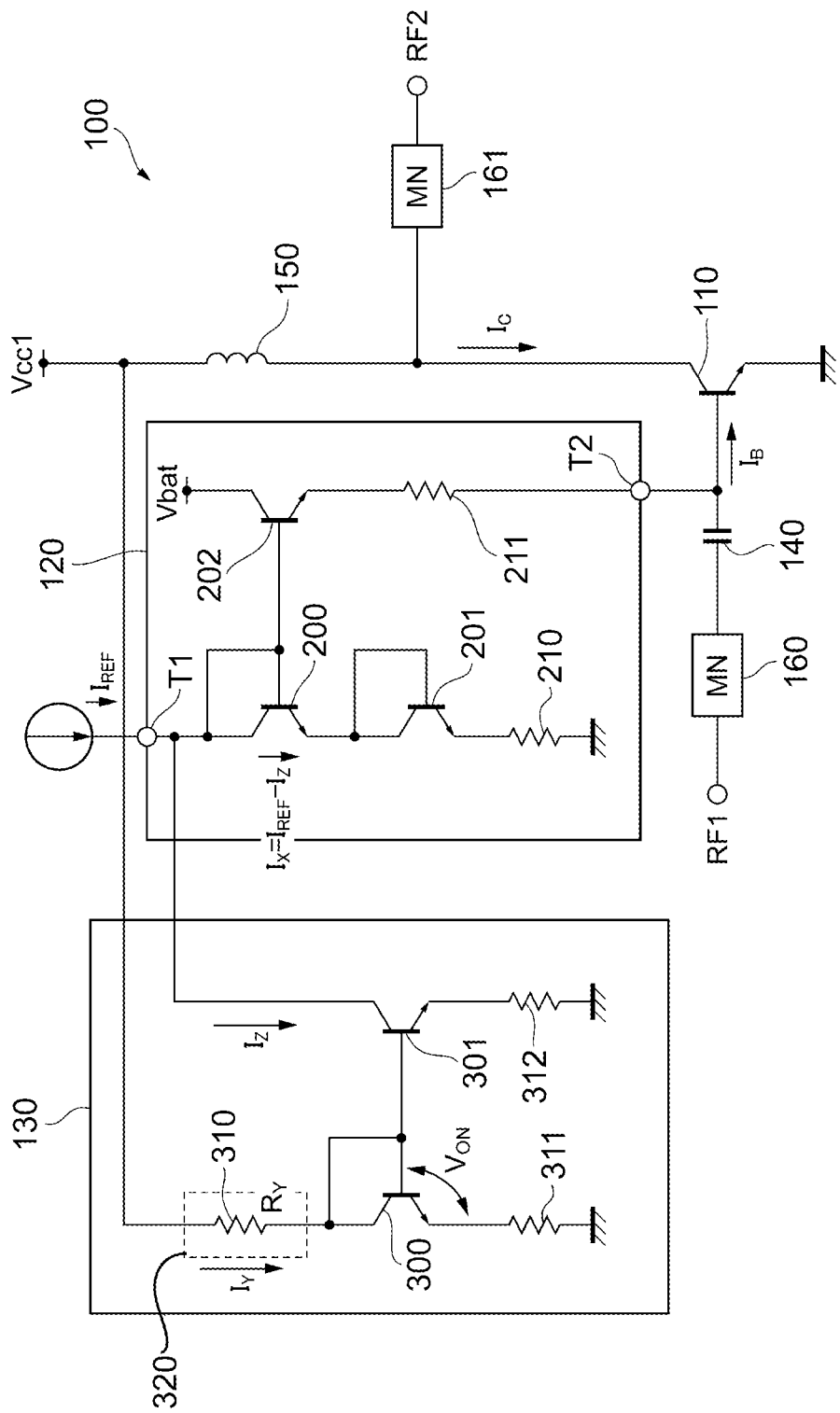
FIG. 1 illustrates an example configuration of a power amplifier circuit according to a first embodiment of the present disclosure.

FIG. 1 illustrates an example configuration of a power amplifier circuit 100 according to a first embodiment of the present disclosure. The power amplifier circuit 100 is mounted in, for example, a mobile communication device such as a mobile phone and is used to amplify power of a radio-frequency (RF) signal to be transmitted to a base station. For example, the power amplifier circuit 100 amplifies transmission signals conforming to communication standards such as the second-generation mobile communication system (2G), the third-generation mobile communication system (3G), the fourth-generation mobile communication system (4G), the fifth-generation mobile communication system (5G), Long Term Evolution Frequency Division Duplex (LTE-FDD), LTE Time Division Duplex (LTE-TDD), LTE-Advanced, and LTE-Advanced Pro. The RF signal has a frequency of about several hundreds of megahertz (MHz) to about several tens of gigahertz (GHz), for example. The power amplifier circuit 100 may amplify signals having other frequencies and conforming to other communication standards.

As illustrated in FIG. 1, the power amplifier circuit 100 includes, for example, a transistor 110, a bias circuit 120, a regulation circuit 130, a capacitor 140, an inductor 150, and matching networks (MNs) 160 and 161.

The transistor 110 (amplifier transistor) is constituted by a bipolar transistor such as a heterojunction bipolar transistor (HBT). The transistor 110 may be constituted by a field-effect transistor (FET) such as a metal-oxide-semiconductor field-effect transistor (MOSFET) instead of by an HBT. In this case, the terms "collector", "base", and "emitter" in the following description are changed to the terms "drain", "gate", and "source", respectively. This also applies to other transistors described below.

A power supply voltage Vcc1 is supplied to a collector (first terminal) of the transistor 110 via the inductor 150, and an RF signal RF1 (input signal) is supplied to a base (second terminal) of the transistor 110 via the matching network 160 and the capacitor 140. An emitter of the transistor 110 is connected to ground. A bias current is supplied to the base of the transistor 110 from the bias circuit 120. Accordingly, an RF signal RF2 (amplified signal), which is obtained by amplifying the RF signal RF1, is outputted from the collector of the transistor 110.

In the power amplifier circuit 100, the power supply voltage Vcc1 supplied to the transistor 110 changes in accordance with the amplitude level of the RF signal inputted to the transistor 110. A power supply voltage is changed in accordance with the amplitude level of a transmission signal, thereby allowing a transistor to operate with the minimum power with which it is possible to guarantee its linearity. Therefore, it is possible to improve power efficiency without compromising linearity compared to, for example, average power tracking (APT) in which a power supply voltage is controlled in accordance with the average output power.

When a typical ET system is to be applied to an RF signal having a relatively wide modulation band width of, for example, 100 MHz or more, it may be difficult to generate a power supply voltage that is made to completely follow the envelope of the RF signal. Accordingly, the power supply voltage Vcc1 according to this embodiment is generated in accordance with a technique for changing the power supply voltage Vcc1 at a slower rate such that the power supply voltage Vcc1 is made to follow an envelope of the envelope of the RF signal, rather than to completely follow the envelope of the RF signal. This technique is hereinafter also referred to as "slow ET system".

Figure 10:
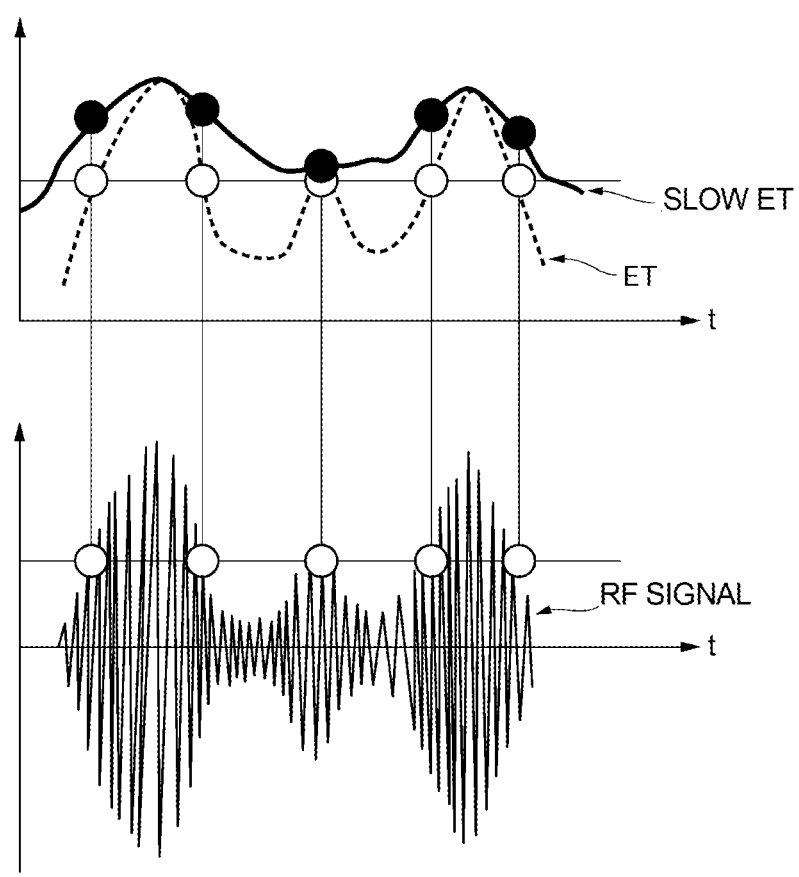
FIG. 10 illustrates a difference between a typical ET system and a slow ET system.

The difference between the typical ET system and the slow ET system will be described with reference to FIG. 10. An RF signal is illustrated in the bottom graph of FIG. 10. In the bottom graph, the horizontal axis represents time, and the vertical axis represents voltage or current signal. In the top graph of FIG. 10, power supply voltages in the typical ET system and the slow ET system are illustrated. In the top graph, the horizontal axis represents time, and the vertical axis represents voltage. In the top graph, white circles indicate values of the power supply voltage at certain instantaneous powers during operation with the typical ET system, and black circles indicate corresponding values of the power supply voltage during operation with the slow ET system.

In the typical ET system, a power supply voltage corresponding to the amplitude of an RF signal is generated, and thus the amplitude of the RF signal and the power supply voltage have a one-to-one correspondence. In the slow ET system, in contrast, the power supply voltage is changed in response to the frequency band of the modulated signal or lower frequency bands. Thus, the power supply voltage may take a different value even at the same instantaneous power. The slow ET system allows the power supply voltage to change at a slower rate than the typical ET system, and thus achieves higher efficiency even when the modulation band width is relatively wide. The detailed configuration of the slow ET system is disclosed in Non-Patent Document discussed in the background section and will not be described.

The bias circuit 120 generates the bias current in accordance with a reference current I=supplied to an input terminal T1 of the bias circuit 120, and supplies the bias current to the base of the transistor 110 from an output terminal T2 of the bias circuit 120. The bias circuit 120 regulates the amount of the bias current to control the bias conditions of the transistor 110.

Specifically, the bias circuit 120 includes, for example, three transistors 200 to 202 and two resistance elements 210 and 211.

A collector and a base of the transistor 200 are connected to each other (hereinafter also referred to as "diode-connected"). The reference current $I_{REF}$ is supplied to the collector of the transistor 200 from the input terminal T1, and an emitter of the transistor 200 is connected to a collector of the transistor 201. The transistor 201 is diode-connected, and an emitter of the transistor 201 is connected to ground. Accordingly, a voltage having a predetermined level (for example, about 2.6 V) is generated at the collector of the transistor 200. A current $I_X$ corresponding to the reference current I=flows between the collector and emitter of the transistor 200. The transistors 200 and 201, which are diode-connected, may be each replaced by a diode.

An end of the resistance element 210 is connected to the emitter of the transistor 201, and another end thereof is connected to ground. The resistance element 210 regulates the voltage generated at the collector of the transistor 200.

A battery voltage Vbat is supplied to a collector of the transistor 202. A base of the transistor 202 is connected to the collector of the transistor 200, and an emitter of the transistor 202 is connected to an end of the resistance element 211. The bias current corresponding to the current $I_X$ is outputted from the emitter of the transistor 202.

The resistance element 211 is disposed between the emitter of the transistor 202 and the base of the transistor 110. The resistance element 211 is provided to regulate the bias current to be supplied from the transistor 202 or to prevent an increase in the temperature of the transistor 110 due to the excessive current flow.

The regulation circuit 130 is a circuit that generates a regulation current for regulating the bias current generated by the bias circuit 120. Specifically, the regulation circuit 130 includes two transistors 300 and 301 and three resistance elements 310 to 312.

The transistor 300 (first transistor) and the transistor 301 (second transistor) are connected in a current mirror configuration. The transistor 300 is diode-connected. The power supply voltage Vcc1 is supplied to a collector of the transistor 300 via the resistance element 310, and an emitter of the transistor 300 is connected to ground via the resistance element 311. The transistor 301 has a collector connected to the collector of the transistor 200, a base connected to a base of the transistor 300, and an emitter connected to ground via the resistance element 312.

The power supply voltage Vcc1 is supplied to an end of the resistance element 310, and another end of the resistance element 310 is connected to the collector of the transistor 300. The resistance element 310 forms an example of a current output circuit 320 that converts the power supply voltage Vcc1 into a current (first current) and outputs the current.

The resistance element 311 has an end connected to the emitter of the transistor 300 and another end connected to ground. The resistance element 312 has an end connected to the emitter of the transistor 301 and another end connected to ground.

With the configuration described above, a regulation current that changes in accordance with a change in the power supply voltage Vcc1 flows between the collector and emitter of the transistor 301. The operational effects of the regulation circuit 130 will be described below.

The capacitor 140 is connected to the base of the transistor 110. The capacitor 140 blocks the direct-current (DC) component included in the RF signal RF1 and allows the alternating-current (AC) component included in the RF signal RF1 to pass therethrough.

The power supply voltage Vcc1 is supplied to an end of the inductor 150, and another end of the inductor 150 is connected to the collector of the transistor 110. The inductor 150 prevents the RF signal RF2, which is outputted from the collector of the transistor 110, from leaking toward a power supply circuit (not illustrated).

Each of the matching networks 160 and 161 matches the impedances of the preceding element and the subsequent element. The matching network 160 matches the impedances of the preceding circuit (not illustrated) of the matching network 160 and the transistor 110. The matching network 161 matches the impedances of the transistor 110 and the subsequent circuit (not illustrated) of the matching network 161. Each of the matching networks 160 and 161 is constituted by, for example, a capacitor and an inductor. The power amplifier circuit 100 may not include any one or both of the matching networks 160 and 161 if any other element has the functions of any one or both of the matching networks 160 and 161.

Prior to the description of the operational effects of the regulation circuit 130, the dependence of the gain of the transistor 110 on the power supply voltage will be described.

Figure 2:
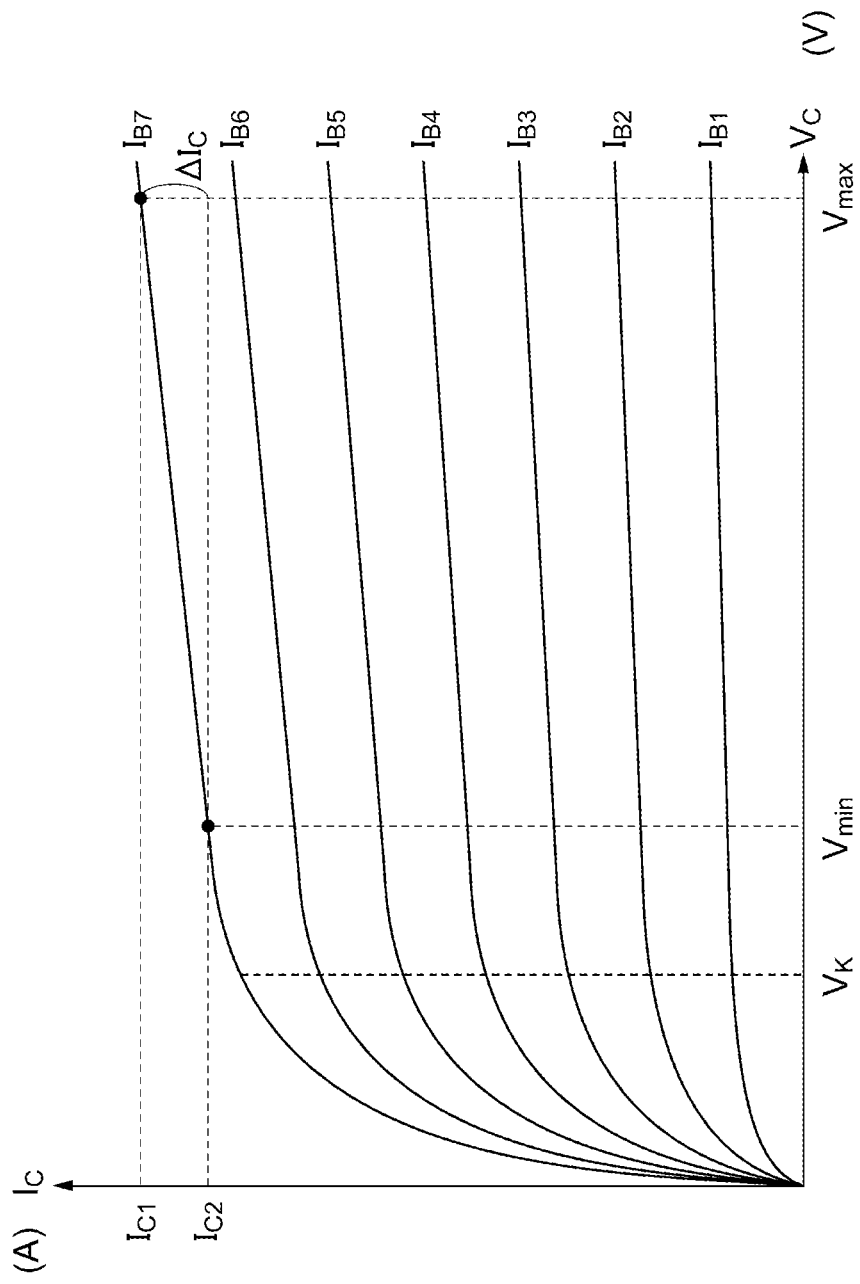
FIG. 2 is a graph illustrating a relationship between the collector voltage and the collector current of a bipolar transistor.

FIG. 2 is a graph illustrating a relationship between the collector voltage and the collector current of a bipolar transistor. In the graph illustrated in FIG. 2, the vertical axis represents the collector current (A), and the horizontal axis represents the collector voltage (V).

As illustrated in FIG. 2, in a bipolar transistor, a collector current $I_C$ has the dependence on a collector voltage $V_C$ even within a linear region where the collector voltage (i.e., the voltage corresponding to the power supply voltage Vcc1 illustrated in FIG. 1) is higher than a threshold value $V_K$. For example, when the base current is denoted by $I_{B7}$, the collector current obtained when the collector voltage $V_C$ has a maximum value $V_{max}$ is denoted by $I_{C1}$ and the collector current obtained when the collector voltage $V_C$ has a minimum value $V_{min}$ is denoted by $I_{C2}$. In this case, there is a difference $\Delta I_C$ between the currents $I_{C1}$ and $I_{C2}$. The gain of a transistor is proportional to a transconductance gm of the transistor, and the transconductance gm is proportional to the collector current. Therefore, the gain of the transistor depends on the collector voltage $V_C$.

The power amplifier circuit 100 operates in accordance with the slow ET system. As described above, in the slow ET system, since the change in power supply voltage does not completely match the envelope of a transmission signal, a power supply voltage with different levels may be generated even for the same level of output powers of a transmission signal. If the dependence of the gain on the power supply voltage is large, the gain may vary in conditions where the gain would be ideally the same. In the slow ET system, therefore, it is desirable that the dependence of the gain on the power supply voltage be small.

In the power amplifier circuit 100 according to this embodiment, the regulation circuit 130 regulates the bias current, thereby reducing the dependence of the gain on the power supply voltage. Specifically, in the regulation circuit 130 illustrated in FIG. 1, the current flowing through the collector and emitter of the transistor 300 is represented by $I_Y$, the current flowing through the collector and emitter of the transistor 301 is represented by $I_Z$, and the resistance value of the resistance element 310 is denoted by $R_Y$. The current mirror amplification factor, which is determined by the size ratio of the transistors 300 and 301 or the resistance values of the resistance elements 311 and 312, is denoted by α, and the diode-on voltage between the base and emitter of the transistor 300 is denoted by $V_{on}$. For simplicity of description, the voltage generated across the resistance element 311 is assumed to be sufficiently low and negligible. Since the transistor 301 is connected to the transistor 300 in a current mirror configuration, the amount of the current $I_Z$ is proportional to the amount of the current $I_Y$ and is represented by $I_Z=\alpha^*I_Y=\alpha^*(Vcc1-V_{on})/R_Y$.

As illustrated in FIG. 1, the collector of the transistor 301 is connected to the collector of the transistor 200. That is, the regulation circuit 130 extracts the current $I_Z$ (regulation current) from the reference current $I_{REF}$ supplied to the input terminal T1 of the bias circuit 120. The current $I_X$ flowing through the transistor 200 of the bias circuit 120 is obtained by subtracting the current $I_Z$ from the reference current $I_{REF}$, that is, $I_X=I_{REF}-I_Z=I_{REF}-\alpha^*(Vcc1-V_{on})/R_Y$. The bias current outputted from the emitter of the transistor 202 is a current obtained by amplifying the current $I_X$ by a current amplification factor β of the bias circuit 120. Accordingly, a base current $I_B$ of the transistor 110 is represented by $I_B=\beta^*I_X=\beta^*\{I_{REF}-\alpha^*(Vcc1-V_{on})/R_Y\}$. A collector current $I_C$ of the transistor 110 is hFE times as large as the base current $I_B$ and is thus represented by $I_C=hFE\times I_B=hFE^*\beta^*\{I_{REF}-\alpha^*(Vcc1-V_{on})/R_Y\}$.

As illustrated in FIG. 2, the base current $I_B$ of the transistor 110 is set to $I_{B7}$ when the power supply voltage Vcc1 has the maximum value $V_{max}$, and the collector current obtained at this time is denoted by $I_{C1}$. The current $I_{C1}$ is represented by $I_{C1}=hFE(V_{max})^*\beta^*\{I_{REF}-\alpha^*(V_{max}-V_{on})/R_Y\}$. In contrast, when the power supply voltage Vcc1 has the minimum value $V_{min}$, due to the dependence of the collector current $I_C$ of the transistor 110 on the collector voltage, the collector current decreases to $I_{C2}$. The current $I_{C2}$ is represented by $I_{C2}=hFE(V_{min})^*\beta^*\{I_{REF}-\alpha^*(V_{min}-V_{on})/R_Y\}$.

To make the decrease of the collector current, $\beta I_C$ ($=I_{C1}-I_{C2}$), zero, $R_Y=\alpha^*[\{hFE(V_{max})/hFE(V_{min})\}^*(V_{max}-V_{on})-(V_{min}-V_{on})]/[\{hFE(V_{max})/hFE(V_{min})-1\}^*I_{REF}]$ is satisfied. That is, even if the power supply voltage Vcc1 changes and the amplification factor hFE changes accordingly, the collector current Ic of the transistor 110 can be kept constant, and the dependence of the gain on the power supply voltage can be reduced.

Specifically, if the reference current $I_{REF}$ remains constant, the current $I_Z$ increases with an increase in the power supply voltage Vcc1, and thus the current $I_X$ ($=I_{REF}-I_Z$) decreases. At this time, the bias current generated by the bias circuit 120 decreases, resulting in a reduction in the gain of the transistor 110. On the other hand, the current $I_Z$ decreases with a decrease in the power supply voltage Vcc1, and thus the current $I_X$ ($=I_{REF}-I_Z$) increases. At this time, the bias current generated by the bias circuit 120 increases, resulting in an increase in the gain of the transistor 110.

In this embodiment, accordingly, the bias current is regulated so as to cancel the gain changes caused by changing the power supply voltage Vcc1, and the base current $I_B$ of the transistor 110 is regulated. As a result, the collector current $I_c$ is regulated. This reduces the dependence of the gain of the transistor 110 on changes in power supply voltage. It is thus possible to reduce gain variation while improving power efficiency.

While the power amplifier circuit 100 according to this embodiment includes a single stage of amplifier, the configuration of the power amplifier circuit 100 may be applied to a power amplifier circuit including a plurality of stages of amplifiers. In this case, the regulation circuit 130 illustrated in FIG. 1 may be used for a bias circuit in any of the stages or may be used for bias circuits in all of the stages.

Figure 3:
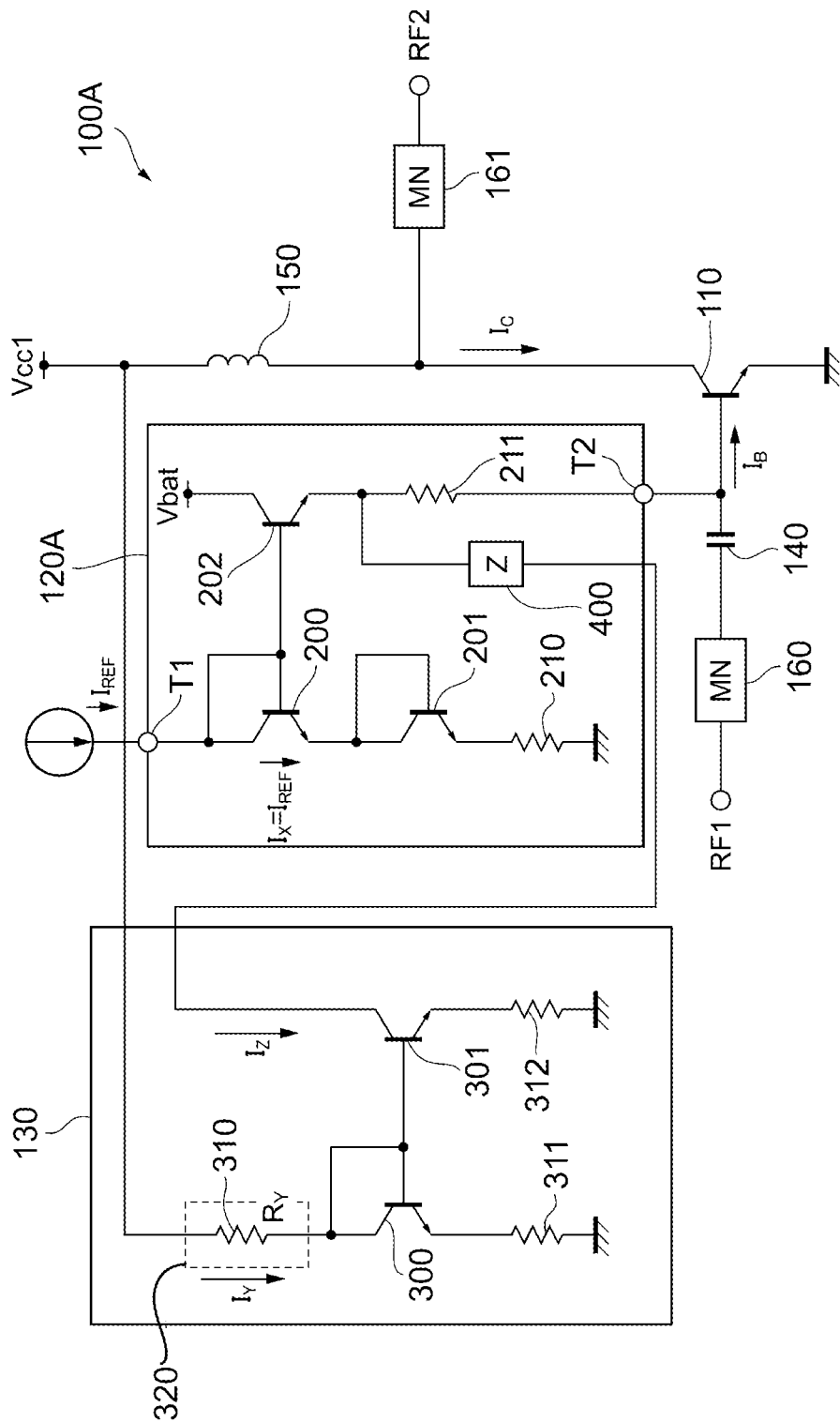
FIG. 3 illustrates an example configuration of a power amplifier circuit according to a modification of the first embodiment of the present disclosure.

FIG. 3 illustrates an example configuration of a power amplifier circuit 100A according to a modification of the first embodiment of the present disclosure. In this modification and the following embodiments, features common to the embodiment described above will not be described, and only the differences will be described. In particular, similar operational effects achieved with similar configurations will not be described again in the modification and the individual embodiments.

As illustrated in FIG. 3, compared to the power amplifier circuit 100 illustrated in FIG. 1, the power amplifier circuit 100A includes a bias circuit 120A in place of the bias circuit 120, and the regulation circuit 130 is connected to a different component.

In this modification, the collector of the transistor 301 of the regulation circuit 130 is connected to the emitter of the transistor 202. Accordingly, the regulation circuit 130 extracts the current $I_Z$ from the bias current outputted from the emitter of the transistor 202.

Compared to the bias circuit 120, the bias circuit 120A further includes an impedance element 400. The impedance element 400 is an element having a predetermined impedance Z. The impedance element 400 is provided to prevent an excessive RF signal from being supplied to the regulation circuit 130 due to the connection of the collector of the transistor 301 to the emitter of the transistor 202. Specifically, the impedance element 400 may be constituted by, for example, an inductor, an LC parallel resonant circuit, a resistance element, or a combining circuit of these components.

With the configuration described above, the base current $I_B$ of the transistor 110 is represented by $I_B=\beta\times I_{REF}-I_Z=\beta\times I_{REF}-\alpha^*(Vcc1-V_{on})/R_Y$. Accordingly, the collector current Ic of the transistor 110 is represented by $I_C=hFE^*I_B=hFE^*\{\beta\times I_{REF}-\alpha^*(Vcc1-V_{on})/R_Y\}$. As in the first embodiment described above, to make $\Delta I_C$ equal to zero, $R_Y=\alpha^*[\{hFE(V_{max})/hFE(V_{min})\}^*(V_{max}-V_{on})-(V_{min}-V_{on})]/[\{hFE(V_{max})/hFE(V_{min})-1\}^*\beta^*I_{REF}]$ is satisfied.

As described above, also in this modification, as in the first embodiment, the collector current can be kept constant even when the power supply voltage changes, and the dependence of the gain of the transistor 110 on the power supply voltage can be reduced. In this way, the regulation circuit 130 may extract the regulation current from the bias current instead of the reference current $I_{REF}$.

The regulation circuit 130 may be configured to be capable of extracting the regulation current from both the reference current $I_{REF}$ and the bias current.

Figure 4:
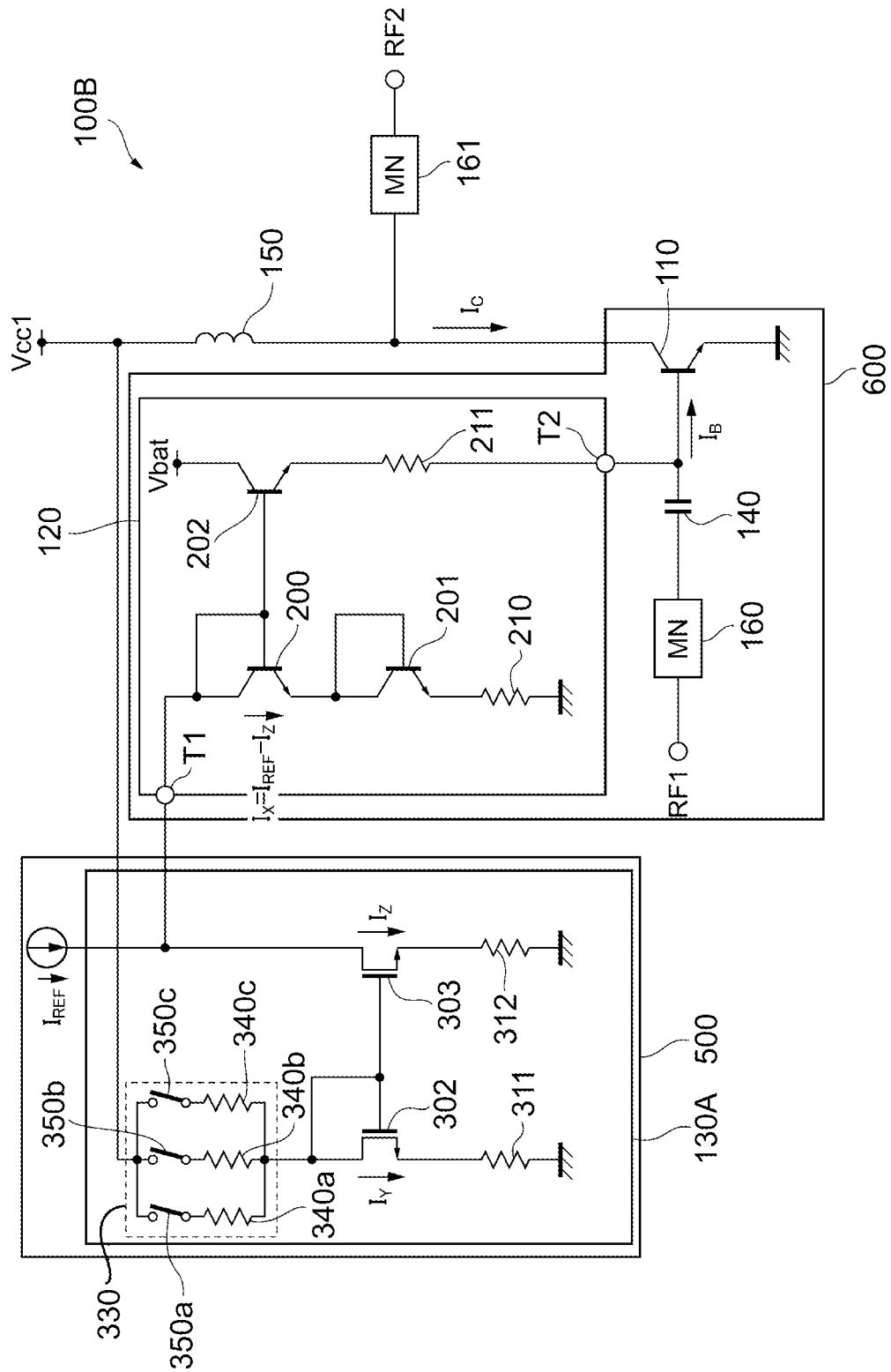
FIG. 4 illustrates an example configuration of a power amplifier circuit according to a second embodiment of the present disclosure.

FIG. 4 illustrates an example configuration of a power amplifier circuit 100B according to a second embodiment of the present disclosure. As illustrated in FIG. 4, compared to the power amplifier circuit 100, the power amplifier circuit 100B includes a regulation circuit 130A in place of the regulation circuit 130.

Compared to the regulation circuit 130, the regulation circuit 130A includes a variable resistor circuit 330 whose resistance value is adjustable, in place of the resistance element 310. The variable resistor circuit 330 is a specific example of a current output circuit that converts the power supply voltage Vcc1 into a current and outputs the current. Specifically, the variable resistor circuit 330 includes three resistance elements 340a to 340c and three switches 350a to 350c. The three resistance elements and three switches are for illustrative purposes only, and the number of resistance elements and the number of switches are not limited to those illustrated in FIG. 4.

The three resistance elements 340a to 340c are connected in parallel with each other. The switches 350a to 350c are connected in series with the resistance elements 340a to 340c, respectively, such that each of the switches 350a to 350c switches the corresponding one of the resistance elements 340a to 340c between a conducting state and a non-conducting state. For example, the on and off states of the switches 350a to 350c are switched in accordance with a change in the power supply voltage Vcc1 to switch a combination of the resistance elements 340a to 340c that are electrically connected. As a result, the resistance value of the variable resistor circuit 330 is adjusted.

In this embodiment, the resistance value of the variable resistor circuit 330 is switchable, and thus the dependence of the gain on the power supply voltage can be reduced with higher accuracy than in the power amplifier circuit 100 described above. The resistance value of the variable resistor circuit 330 may be switched in accordance with a change in the power supply voltage Vcc1, for example, or may be switched in accordance with a change in the collector current $I_C$ of the transistor 110.

Further, the regulation circuit 130A includes transistors 302 and 303 in place of the transistors 300 and 301. Each of the transistors 302 and 303 is constituted by, for example, an FET such as a MOSFET. Each of the switches 350a to 350c can also be constituted by an FET such as a MOSFET. Accordingly, in the regulation circuit 130A, each element can be fabricated by complementary metal-oxide-semiconductor (CMOS) process. In this embodiment, therefore, the regulation circuit 130A can be incorporated in an integrated circuit (IC) chip 500 for generating the reference current $I_{REF}$, thereby facilitating an increase in the degree of integration, compared to the power amplifier circuits 100 and 100A described above. The transistor 110, the bias circuit 120, the capacitor 140, and the matching network 160 may be mounted on an RF chip 600.

With this configuration, the power amplifier circuit 100B can also achieve advantages similar to those of the power amplifier circuit 100. In addition, the power amplifier circuit 100B can easily provide an increased degree of integration, compared to the power amplifier circuit 100.

In FIG. 4, the transistors 200 to 202 included in the bias circuit 120 are each constituted by a bipolar transistor, by way of example. However, some or all of the transistors 200 to 202 may be constituted by an FET. In this case, the FETs included in the bias circuit 120 may be mounted on the IC chip 500 in a manner similar to that of the regulation circuit 130A.

Figure 5:
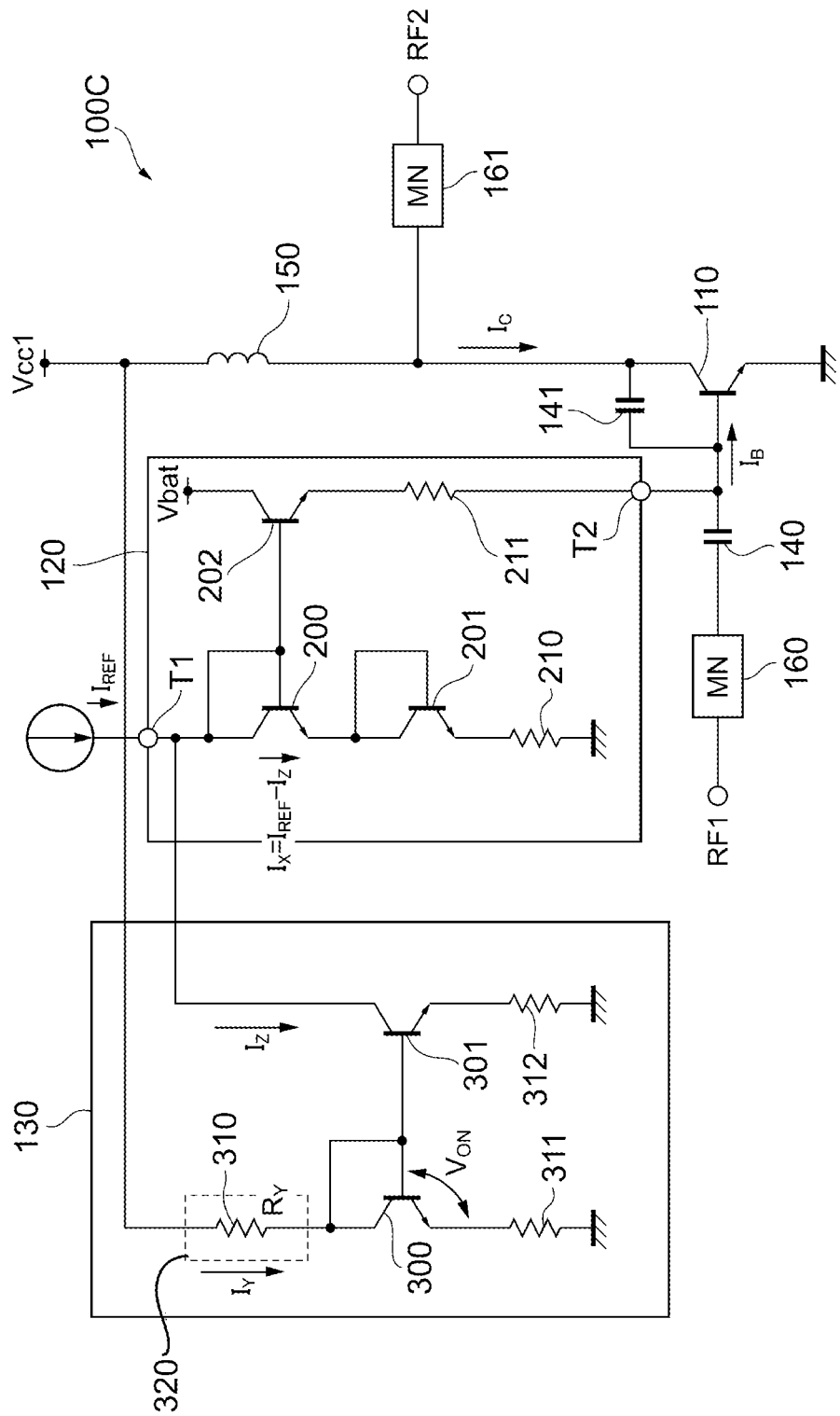
FIG. 5 illustrates an example configuration of a power amplifier circuit according to a third embodiment of the present disclosure.

FIG. 5 illustrates an example configuration of a power amplifier circuit 100C according to a third embodiment of the present disclosure. As illustrated in FIG. 5, compared to the power amplifier circuit 100, the power amplifier circuit 100C further includes a capacitor 141.

The capacitor 141 is disposed between the base and collector of the transistor 110. The functions of the capacitor 141 will now be described with reference to FIGS. 6 and 7.

Figure 6:
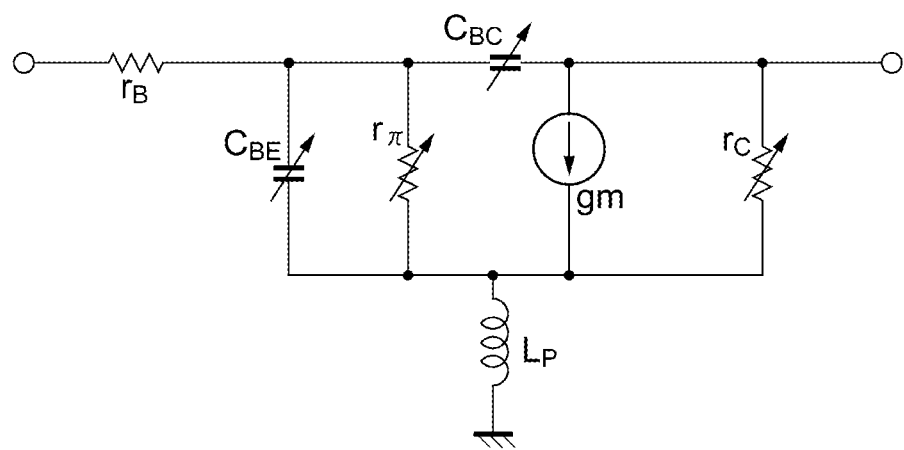
FIG. 6 illustrates an equivalent circuit of a transistor.

FIG. 6 illustrates an equivalent circuit of a transistor. In FIG. 6, the resistance value of the base is denoted by $r_B$, the resistance value of the collector is denoted by $r_C$, the resistance value of the input impedance of the transistor is denoted by $r_\pi$, the transconductance is denoted by gm, the capacitance value of the parasitic capacitance between the base and emitter is denoted by $C_{BE}$, the capacitance value of the parasitic capacitance between the base and collector is denoted by $C_{BC}$, and the inductance value of the parasitic inductance between the emitter and ground is denoted by $L_p$. The capacitance value of the parasitic capacitance between the base and emitter of the transistor or the capacitance value of the parasitic capacitance between the base and collector changes in accordance with the collector voltage, for example.

Figure 7:
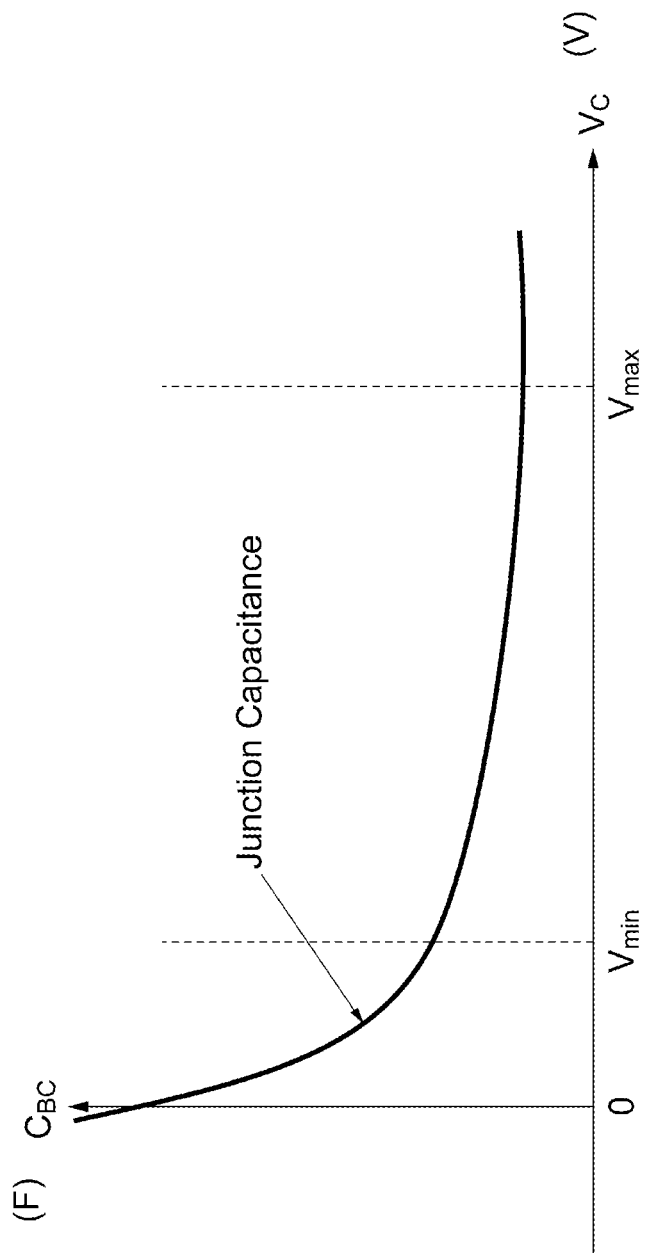
FIG. 7 is a graph illustrating a relationship between the collector voltage of the transistor and the capacitance value of the parasitic capacitance between the base and collector of the transistor.

FIG. 7 is a graph illustrating a relationship between the collector voltage of the transistor and the capacitance value of the parasitic capacitance between the base and collector of the transistor. In the graph illustrated in FIG. 7, the vertical axis represents the capacitance value (F) of the parasitic capacitance between the base and the collector, and the horizontal axis represents the collector voltage (V).

As illustrated in FIG. 7, the capacitance between the base and collector of the transistor is junction capacitance, with the capacitance value decreasing with an increase in collector voltage and the capacitance value increasing with a decrease in collector voltage. As a result of the application of this characteristic to the power amplifier circuit 100C illustrated in FIG. 5, as the power supply voltage Vcc1 decreases, the capacitance value of the parasitic capacitance between the base and collector of the transistor 110 increases. The increase in the capacitance value of the parasitic capacitance between the base and collector is equivalent to an increase in negative feedback capacitance between the collector and base of the transistor 110, resulting in a reduction in the gain of the transistor 110.

In this embodiment, the capacitor 141, which is a linear capacitor, is connected in parallel between the base and collector of the transistor 110. The parallel connection of a linear capacitor relaxes the dependence of the base-collector capacitance on the power supply voltage. This can reduce the influence on changes in parasitic capacitance between the base and collector of the transistor 110 even if the power supply voltage Vcc1 changes.

With the configuration described above, the power amplifier circuit 100C can further reduce the dependence of the gain of the transistor 110 on the power supply voltage, compared to the power amplifier circuit 100. In FIG. 5, the capacitor 141 is used in the configuration of the power amplifier circuit 100 illustrated in FIG. 1, by way of example, the configuration to which the capacitor 141 is applied is not limited to this example. The capacitor 141 may be used in any other circuit configuration.

Figure 8:
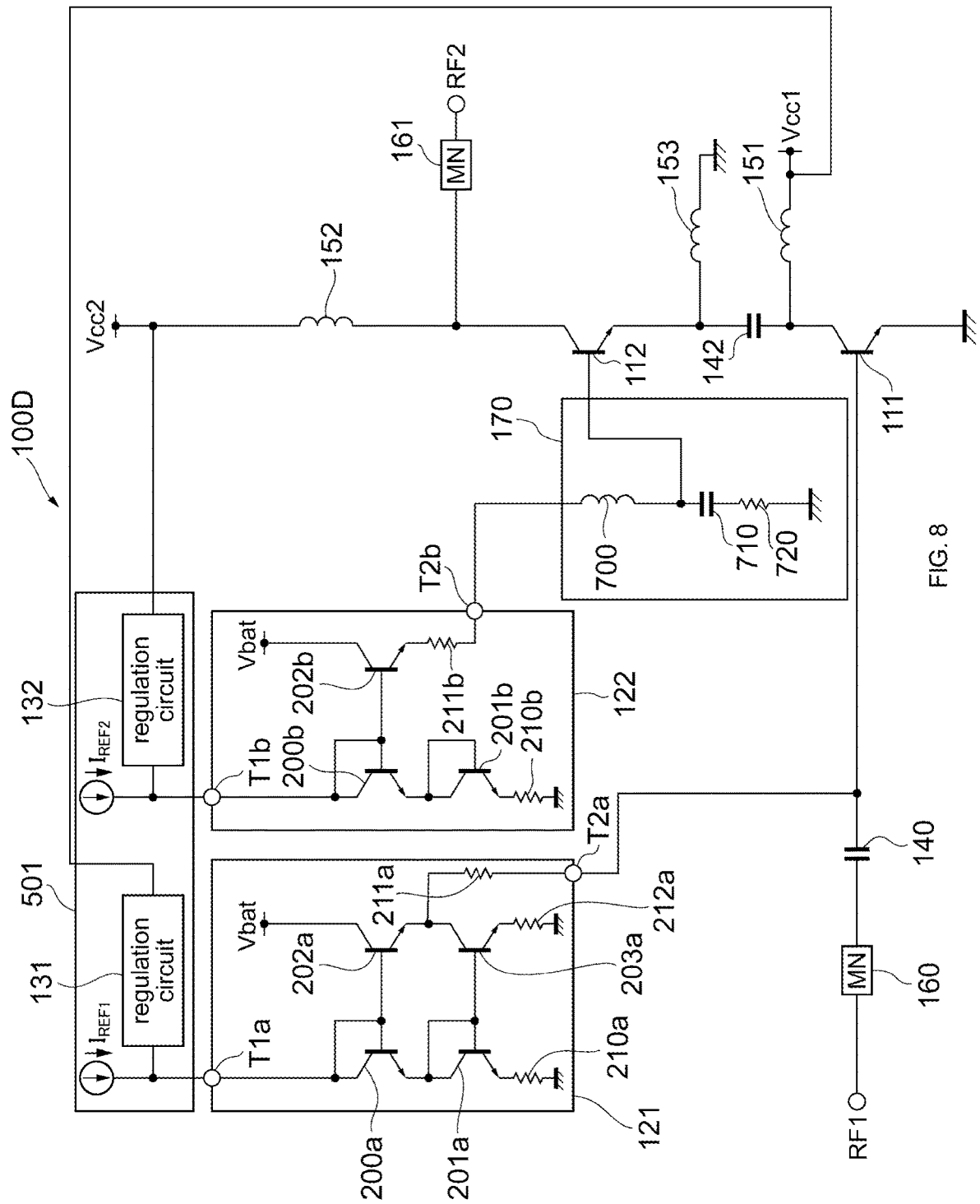
FIG. 8 illustrates an example configuration of a power amplifier circuit according to a fourth embodiment of the present disclosure.

FIG. 8 illustrates an example configuration of a power amplifier circuit 100D according to a fourth embodiment of the present disclosure. As illustrated in FIG. 8, the power amplifier circuit 100D is different from the power amplifier circuit 100 in the configuration of an amplifier.

The power amplifier circuit 100D includes, for example, two vertically connected transistors 111 and 112, bias circuits 121 and 122, regulation circuits 131 and 132, capacitors 140 and 142, inductors 151 to 153, matching networks 160 and 161, and an impedance adjustment circuit 170.

A power supply voltage Vcc1 (first power supply voltage) is supplied to a collector (first terminal) of the lower transistor 111 (lower transistor) via the inductor 151, and an RF signal RF1 (input signal) is supplied to a base (second terminal) of the lower transistor 111 via the matching network 160 and the capacitor 140. An emitter (third terminal) of the lower transistor 111 is connected to ground. A bias current (first bias current) is supplied to the base of the transistor 111 from the bias circuit 121.

A power supply voltage Vcc2 (second power supply voltage) is supplied to a collector (first terminal) of the upper transistor 112 (upper transistor) via the inductor 152, and a bias current (second bias current) is supplied to a base (second terminal) of the upper transistor 112 from the bias circuit 122 via the impedance adjustment circuit 170. An emitter (third terminal) of the upper transistor 112 is connected to ground via the inductor 153. The emitter of the transistor 112 is connected to the collector of the lower transistor 111 via the capacitor 142. With this configuration, the lower transistor 111 and the upper transistor 112 synchronously perform similar amplification operations, and an RF signal RF2 (amplified signal), which is obtained by amplifying the RF signal RF1, is outputted from the collector of the transistor 112.

The bias circuit 121 (first bias circuit) generates a bias current in accordance with a reference current I11 supplied to an input terminal T1a of the bias circuit 121, and supplies the bias current to the base of the transistor 111 from an output terminal T2a of the bias circuit 121. The bias circuit 121 includes, for example, transistors 200a to 203a and resistance elements 210a to 212a. Compared to the bias circuit 120 illustrated in FIG. 1, the bias circuit 121 further includes the transistor 203a and the resistance element 212a. The transistor 203a has a collector connected to the emitter of the transistor 202a, a base connected to the base of the transistor 201a, and an emitter connected to ground via the resistance element 212a. The resistance element 212a has an end connected to the emitter of the transistor 203a and another end connected to ground. The transistor 203a functions to extract a current from the transistor 202a to provide stable supply of a bias current from the transistor 202a to the lower transistor 111.

The bias circuit 122 (second bias circuit) generates a bias current in accordance with a reference current $I_{REF2}$ supplied to an input terminal T1b of the bias circuit 122, and supplies the bias current to the base of the transistor 112 from an output terminal T2b of the bias circuit 122. The bias circuit 122 includes, for example, transistors 200b to 202b and resistance elements 210b and 211b. The specific configuration of the bias circuit 122 is similar to that of the bias circuit 120 illustrated in FIG. 1 and will not be described in detail.

The regulation circuit 131 (first regulation circuit) generates a regulation current (first regulation current) in accordance with a change in the power supply voltage Vcc1 and extracts the regulation current from the reference current $I_{REF1}$ (first reference current) that is supplied to the bias circuit 121. The regulation circuit 132 (second regulation circuit) generates a regulation current (second regulation current) in accordance with a change in the power supply voltage Vcc2 and extracts the regulation current from the reference current $I_{REF2}$ (second reference current) that is supplied to the bias circuit 122. The regulation circuit 131 and the regulation circuit 132 may be incorporated in the same IC chip 501. The specific configuration of the regulation circuits 131 and 132 may be similar to that of the regulation circuit 130 illustrated in FIG. 1, for example, and will not be described in detail.

The capacitor 142 (intermediate capacitor) has an end connected to the emitter of the upper transistor 112 and another end connected to the collector of the lower transistor 111. The capacitor 142 has a function of isolating the upper transistor 112 and the lower transistor 111 from each other for DC and connecting the upper transistor 112 and the lower transistor 111 to each other for AC.

The power supply voltage Vcc1 is supplied to an end of the inductor 151, and another end of the inductor 151 is connected to the collector of the transistor 111. The power supply voltage Vcc2 is supplied to an end of the inductor 152, and another end of the inductor 152 is connected to the collector of the transistor 112. An end of the inductor 153 is connected to the emitter of the upper transistor 112, and another end of the inductor 153 is connected to ground. The inductor 153 has a function of connecting the emitter of the upper transistor 112 to ground for DC.

The impedance adjustment circuit 170 is disposed between the bias circuit 122 and the base of the upper transistor 112. The impedance adjustment circuit 170 adjusts the impedance seen from the base of the transistor 112. Specifically, the impedance adjustment circuit 170 includes an inductor 700, a capacitor 710, and a resistance element 720, which are connected in series with one another.

The inductor 700 and the capacitor 710 are provided to match the impedance seen from the base of the transistor 112. To turn on the upper transistor 112, the base voltage of the transistor 112 needs to change in accordance with a change in emitter voltage. The capacitor 710 changes the base voltage of the transistor 112 in accordance with the amplitude of the signal to be amplified by the transistor 112, such that an amplitude change of the base voltage of the transistor 112 is not restricted by the output terminal T2b of the bias circuit 122. It is desirable that the capacitor 710 have a smaller capacitance value than the capacitor 142, for example. This is because if the capacitance value of the capacitor 710 is excessively large, the change in the base voltage of the transistor 112 is suppressed.

The resistance element 720, which has a predetermined impedance, is provided to intentionally consume the energy of the signal. Consumption of the energy of the signal in the resistance element 720 improves the stability of the transistor 112 and suppresses oscillation.

Next, the operation of the amplifier will be described in detail. In the following description, the power supply voltage Vcc1 and the power supply voltage Vcc2 are each 3 V.

The collector voltage of the lower transistor 111 changes in the range of DC 3 V±AC 3 V since the power supply voltage Vcc1 (DC 3 V) is supplied to the collector of the lower transistor 111 for DC. The emitter voltage of the upper transistor 112 changes in the range of DC 0 V±AC 3 V since the emitter of the upper transistor 112 is connected to ground for DC and is connected to the collector of the lower transistor 111 for AC. The collector voltage of the upper transistor 112 changes in the range of DC 3 V±AC 6 V since the power supply voltage Vcc2 (DC 3 V) is supplied to the collector of the upper transistor 112 for DC and the signal amplitudes at the collector and emitter of the transistor 112 are added together for AC. Accordingly, the signal amplitude across the collector and emitter of the upper transistor 112 is the same as the signal amplitude across the collector and emitter of the lower transistor 111, whereas the signal amplitude at the collector of the upper transistor 112 is twice as high as the signal amplitude across the collector and emitter. Accordingly, the power amplifier circuit 100D can increase the maximum output power of the signal without increasing the power supply voltages Vcc1 and Vcc2.

As described above, even in a configuration in which two transistors for amplification are vertically connected, the regulation circuits 131 and 132 are connected to the bias circuits 121 and 122, respectively, thereby reducing the dependence of the gain on the power supply voltage in a way similar to that in the power amplifier circuit 100 described above. In addition, the power amplifier circuit 100D according to this embodiment can increase the output power, compared to the power amplifier circuits 100 and 100A to 100C described above.

In the power amplifier circuit 100D, furthermore, each of the upper and lower transistors is provided with a bias circuit. With this configuration, for example, even if the lower transistor 111 and the upper transistor 112, which are required to operate synchronously, do not operate in balance, suitable bias currents can be supplied to the transistors 111 and 112. This is not intended to exclude a configuration in which a single bias circuit supplies a bias current to both the lower transistor 111 and the upper transistor 112. The configuration in which a single bias circuit supplies a bias current to both transistors can achieve a smaller circuit scale than the configuration in which each transistor is provided with a bias circuit and a regulation circuit.

In the power amplifier circuit 100D, an amplifier is configured such that two transistors are vertically connected. The number of transistors that are connected vertically is not limited to two, and three or more transistors may be connected vertically.

Furthermore, the bias circuits 120 and 120A in the power amplifier circuits 100 and 100A to 100C described above may have the configuration of the bias circuit 121 illustrated in FIG. 8.

Figure 9:
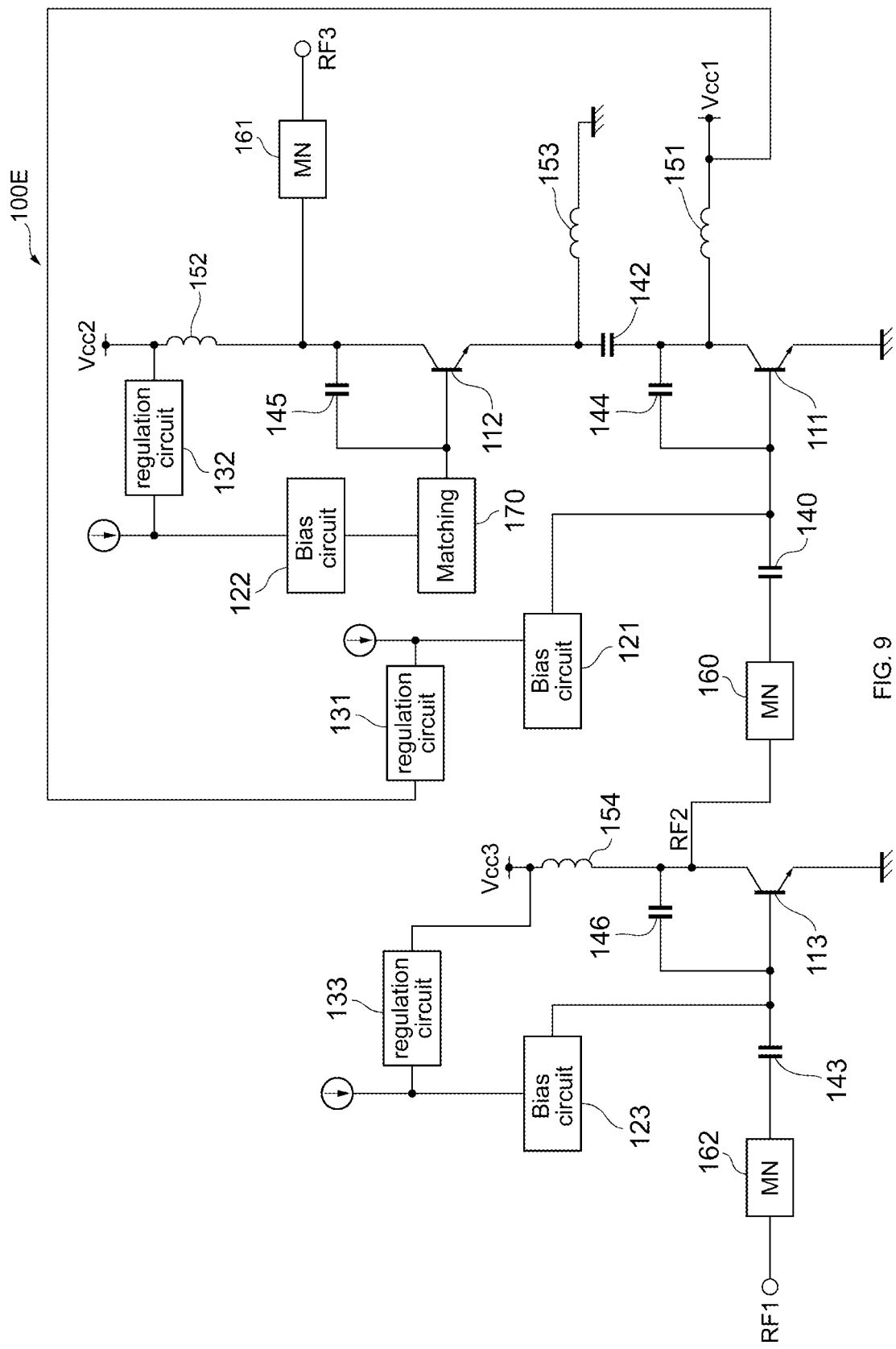
FIG. 9 illustrates an example configuration of a power amplifier circuit according to a fifth embodiment of the present disclosure.

FIG. 9 illustrates an example configuration of a power amplifier circuit 100E according to a fifth embodiment of the present disclosure. As illustrated in FIG. 9, compared to the power amplifier circuit 100D illustrated in FIG. 8, the power amplifier circuit 100E further includes an amplifier in the preceding stage of the amplifier, and further includes capacitors 144 to 146.

That is, the power amplifier circuit 100E includes two stages of amplifiers. The amplifier in the initial stage (drive stage) amplifies the RF signal RF1 and outputs the RF signal RF2. The amplifier in the subsequent stage (power stage) amplifies the RF signal RF2 (input signal) and outputs an RF signal RF3 (amplified signal). In this way, the power amplifier circuit 100 amplifies the power of a transmission signal in two stages.

The amplifier in the preceding stage includes, for example, a transistor 113, a bias circuit 123, a regulation circuit 133, capacitors 143 and 146, an inductor 154, and a matching network 162. The transistor 113, the bias circuit 123, the regulation circuit 133, the capacitors 143 and 146, the inductor 154, and the matching network 162 correspond to the transistor 110, the bias circuit 120, the regulation circuit 130, the capacitors 140 and 141, the inductor 150, and the matching network 160 in the power amplifier circuit 100C illustrated in FIG. 5, respectively, and will not be described in detail.

In the amplifier in the subsequent stage, the capacitor 144 (first capacitor) is disposed between the base and collector of the lower transistor 111. The capacitor 145 (second capacitor) is disposed between the base and collector of the upper transistor 112. Like the capacitor 141 illustrated in FIG. 5, the capacitors 144 and 145 have a function of reducing the influence on changes in parasitic capacitance between the bases and collectors of the transistors 111 and 112, respectively.

As described above, even in a configuration including two stages of amplifiers, the regulation circuit 130 can be used. In FIG. 9, the capacitors 144 to 146 are disposed between the bases and collectors of the transistors 111 to 113, respectively, by way of example but not limitation. Such a capacitor may not be provided for all of the transistors 111 to 113, but may be provided for some of the transistors 111 to 113.

Exemplary embodiments of the present disclosure have been described. The power amplifier circuits 100 and 100A to 100C include the transistor 110 having a first terminal and a second terminal, wherein the power supply voltage Vcc1 that changes in accordance with an amplitude level of an input signal is supplied to the first terminal, the input signal and a bias current are supplied to the second terminal, and an amplified signal obtained by amplifying the input signal is outputted from the first terminal; the bias circuits 120 and 120A that output the bias current from the output terminal T2 in accordance with the reference current $I_{REF}$ supplied to the input terminal T1; and the regulation circuits 130 and 130A that generate a regulation current for regulating the bias current in accordance with a change in the power supply voltage Vcc1. The regulation current is a current that increases with an increase in the power supply voltage Vcc1 and decreases with a decrease in the power supply voltage Vcc1. The regulation circuits 130 and 130A extract the regulation current from at least one of the reference current $I_{REF}$ or the bias current. With this configuration, the bias current is regulated so as to cancel the gain changes caused by changing the power supply voltage Vcc1, and the collector current $I_C$ is regulated accordingly. Accordingly, the dependence of the gain of the amplifier on changes in the power supply voltage Vcc1 is made low. It is thus possible to reduce gain variation while improving power efficiency.

As a non-limiting example, the regulation circuits 130 and 130A may include, for example, a current output circuit, the transistors 300 and 302, the transistors 301 and 303. The current output circuit may convert the power supply voltage Vcc1 into a first current and output the first current. The transistors 300 and 302 and the transistors 301 and 303 may be connected in a current mirror configuration and configured to generate the regulation current corresponding to the first current.

In the power amplifier circuit 100B, the current output circuit includes the variable resistor circuit 330 having a resistance value that is adjustable in accordance with a change in the power supply voltage Vcc1. With this configuration, for example, it is possible to switch the resistance value in accordance with a change in the collector current of the transistor 110. Thus, the dependence of the gain on the power supply voltage can be reduced with higher accuracy than that in the power amplifier circuit 100.

In the power amplifier circuit 100B, furthermore, the variable resistor circuit 330 includes the plurality of resistance elements 340a to 340c that are connected in parallel with each other, and the plurality of switches 350a to 350c each configured to switch one of the plurality of resistance elements 340a to 340c between a conducting state and a non-conducting state, and the transistor 302, the transistor 303, and the plurality of switches 350a to 350c are each constituted by an FET. With this configuration, the regulation circuit 130A can be incorporated in the IC chip 500 for generating the reference current $I_{REF}$, facilitating an increase in the degree of integration.

The power amplifier circuit 100C further includes the capacitor 141 disposed between the collector and base of the transistor 110. With this configuration, even if the power supply voltage Vcc1 changes, the influence on changes in parasitic capacitance between the base and collector of the transistor 110 can be reduced.

The power amplifier circuits 100D and 100E include the transistor 111 having a first terminal, a second terminal, and a third terminal, wherein a first power supply voltage that changes in accordance with an amplitude level of an input signal is supplied to the first terminal, the input signal and a first bias current are supplied to the second terminal, and the third terminal is connected to ground; the capacitor 142; the transistor 112 having a first terminal, a second terminal, and a third terminal, wherein a second power supply voltage that changes in accordance with the amplitude level of the input signal is supplied to the first terminal, an amplified signal obtained by amplifying the input signal is outputted from the first terminal, a second bias current is supplied to the second terminal, and the third terminal is connected to the first terminal of the transistor 111 via the capacitor 142; the inductor 153 that connects the third terminal of the transistor 112 to ground; a first bias circuit that outputs the first bias current from an output terminal of the first bias circuit in accordance with a first reference current supplied to an input terminal of the first bias circuit; a second bias circuit that outputs the second bias current from an output terminal of the second bias circuit in accordance with a second reference current supplied to an input terminal of the second bias circuit; a first regulation circuit that generates a first regulation current for regulating the first bias current in accordance with a change in the first power supply voltage; a second regulation circuit that generates a second regulation current for regulating the second bias current in accordance with a change in the second power supply voltage; and the impedance adjustment circuit 170 disposed between the second terminal of the transistor 112 and the second bias circuit and configured to adjust an impedance seen from the second terminal of the transistor 112. The first regulation current is a current that increases with an increase in the first power supply voltage and decreases with a decrease in the first power supply voltage, and the second regulation current is a current that increases with an increase in the second power supply voltage and decreases with a decrease in the second power supply voltage. The first regulation circuit extracts the first regulation current from at least one of the first reference current supplied to the first bias circuit or the first bias current, and the second regulation circuit extracts the second regulation current from at least one of the second reference current supplied to the second bias circuit or the second bias current. With this configuration, the first bias current and the second bias current are regulated so as to cancel the gain changes caused by changing the power supply voltages Vcc1 and Vcc2, and the collector current $I_C$ of the transistor 112 is regulated accordingly. Accordingly, the dependence of the gain of the amplifier on changes in the power supply voltages Vcc1 and Vcc2 is made low. It is thus possible to reduce gain variation while improving power efficiency.

The power amplifier circuit 100E further includes the capacitor 144 disposed between the first terminal and the second terminal of the transistor 111, and the capacitor 145 disposed between the first terminal and the second terminal of the transistor 112. With this configuration, even if the power supply voltages Vcc1 and Vcc2 change, the influence on changes in parasitic capacitance between the bases and collectors of the transistor 111 and the transistor 112 can be reduced.

The embodiments described above are intended to help easily understand the present disclosure, and are not to be used to construe the present disclosure in a limiting fashion. Various modifications or improvements can be made to the present disclosure without departing from the gist of the present disclosure, and equivalents thereof are also included in the present disclosure. That is, the embodiments may be appropriately modified in design by those skilled in the art, and such modifications also fall within the scope of the present disclosure so long as the modifications include the features of the present disclosure. For example, the elements included in the embodiments and the arrangement, materials, conditions, shapes, sizes, and the like thereof are not limited to those described in the illustrated examples, but can be modified as appropriate. Furthermore, the elements included in the embodiments can be combined as much as technically possible, and such combinations of elements also fall within the scope of the present disclosure so long as the combinations of elements include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
   an amplifier transistor having a first terminal and a second terminal, wherein a power supply voltage that changes in accordance with an amplitude level of an input signal is supplied to the first terminal, the input signal and a bias current are supplied to the second terminal, and an amplified signal obtained by amplifying the input signal is output from the first terminal;
   a bias circuit that outputs the bias current from an output terminal of the bias circuit in accordance with a reference current supplied to an input terminal of the bias circuit; and
   a regulation circuit that generates a regulation current for regulating the bias current in accordance with a change in the power supply voltage,
   wherein the regulation current is a current that increases with an increase in the power supply voltage and decreases with a decrease in the power supply voltage, and
   wherein the regulation circuit extracts the regulation current from at least one of the reference current or the bias current.

2. The power amplifier circuit according to claim 1,
   wherein the regulation circuit includes a current output circuit, a first transistor, and a second transistor,
   wherein the current output circuit converts the power supply voltage into a first current and outputs the first current, and
   wherein the first transistor and the second transistor are connected in a current mirror configuration and are configured to generate the regulation current corresponding to the first current.

3. The power amplifier circuit according to claim 2,
   wherein the current output circuit includes a variable resistor circuit having a resistance value that is adjustable in accordance with a change in the power supply voltage.

4. The power amplifier circuit according to claim 3,
   wherein the variable resistor circuit includes a plurality of resistance elements that are connected in parallel with each other, and a plurality of switches each configured to switch one of the plurality of resistance elements between a conducting state and a non-conducting state, and
   wherein the first transistor, the second transistor, and the plurality of switches are each constituted by a field-effect transistor.

5. The power amplifier circuit according to claim 1, further comprising
   a capacitor disposed between the first terminal and the second terminal of the amplifier transistor.

6. The power amplifier circuit according to claim 2, further comprising
   a capacitor disposed between the first terminal and the second terminal of the amplifier transistor.

7. The power amplifier circuit according to claim 3, further comprising
a capacitor disposed between the first terminal and the second terminal of the amplifier transistor.

8. The power amplifier circuit according to claim 4, further comprising
a capacitor disposed between the first terminal and the second terminal of the amplifier transistor.

9. The power amplifier circuit according to claim 1,
wherein the power supply voltage is supplied to the first terminal of the amplifier transistor via an inductor, and the input signal is supplied to the second terminal of the amplifier transistor via a first matching network and a capacitor.

10. The power amplifier circuit according to claim 9, further comprising a second matching network connected to the first terminal of the amplifier transistor.

11. The power amplifier circuit according to claim 1,
wherein the bias circuit comprises at least two diode-connected transistors and at least two resistors.

12. The power amplifier circuit according to claim 1,
wherein the bias circuit further comprises a third transistor and an impedance element connected between the third transistor and one of the at least two resistors.

13. A power amplifier circuit comprising:
a lower transistor having a first terminal, a second terminal, and a third terminal, wherein a first power supply voltage that changes in accordance with an amplitude level of an input signal is supplied to the first terminal, the input signal and a first bias current are supplied to the second terminal, and the third terminal is connected to ground;
an intermediate capacitor;
an upper transistor having a first terminal, a second terminal, and a third terminal, wherein a second power supply voltage that changes in accordance with the amplitude level of the input signal is supplied to the first terminal, an amplified signal obtained by amplifying the input signal is output from the first terminal, a second bias current is supplied to the second terminal, and the third terminal is connected to the first terminal of the lower transistor via the intermediate capacitor;
a first inductor that connects the third terminal of the upper transistor to ground;
a first bias circuit that outputs the first bias current from an output terminal of the first bias circuit in accordance with a first reference current supplied to an input terminal of the first bias circuit;
a second bias circuit that outputs the second bias current from an output terminal of the second bias circuit in accordance with a second reference current supplied to an input terminal of the second bias circuit;
a first regulation circuit that generates a first regulation current for regulating the first bias current in accordance with a change in the first power supply voltage;
a second regulation circuit that generates a second regulation current for regulating the second bias current in accordance with a change in the second power supply voltage; and
an impedance adjustment circuit disposed between the second terminal of the upper transistor and the second bias circuit and configured to adjust an impedance seen from the second terminal of the upper transistor,
wherein the first regulation current is a current that increases with an increase in the first power supply voltage and decreases with a decrease in the first power supply voltage,
wherein the second regulation current is a current that increases with an increase in the second power supply voltage and decreases with a decrease in the second power supply voltage,
wherein the first regulation circuit extracts the first regulation current from at least one of the first reference current or the first bias current, and
wherein the second regulation circuit extracts the second regulation current from at least one of the second reference current or the second bias current.

14. The power amplifier circuit according to claim 13, further comprising:
a first capacitor disposed between the first terminal of the lower transistor and the second terminal of the lower transistor; and
a second capacitor disposed between the first terminal of the upper transistor and the second terminal of the upper transistor.

15. The power amplifier circuit according to claim 13,
wherein at least one of the first regulation circuit or the second regulation circuit includes a current output circuit, a first transistor, and a second transistor,
wherein the current output circuit converts at least one of the first power supply voltage or the second power supply voltage into a first current and outputs the first current, and
wherein the first transistor and the second transistor are connected in a current mirror configuration and are configured to generate the regulation current corresponding to the first current.

16. The power amplifier circuit according to claim 15,
wherein the current output circuit includes a variable resistor circuit having a resistance value that is adjustable in accordance with a change in the at least one of the first power supply voltage or the second power supply voltage.

17. The power amplifier circuit according to claim 16,
wherein the variable resistor circuit includes a plurality of resistance elements that are connected in parallel with each other, and a plurality of switches each configured to switch one of the plurality of resistance elements between a conducting state and a non-conducting state, and
wherein the first transistor, the second transistor, and the plurality of switches are each constituted by a field-effect transistor.

18. The power amplifier circuit according to claim 13,
wherein the second power supply voltage is supplied to the first terminal of the upper transistor via a second inductor, and the input signal is supplied to the second terminal of the lower transistor via a first matching network and a third capacitor.

19. The power amplifier circuit according to claim 18, further comprising a second matching network connected to the first terminal of the upper transistor.

20. The power amplifier circuit according to claim 13,
wherein the first power supply voltage is supplied to the first terminal of the lower transistor via a third inductor.

* * * * *

UNITED STATES PATENT AND TRADEMARK OFFICE
CERTIFICATE OF CORRECTION

| | |
|---|---|
| PATENT NO. | : 11,114,982 B2 |
| APPLICATION NO. | : 16/821282 |
| DATED | : September 7, 2021 |
| INVENTOR(S) | : Satoshi Tanaka et al. |

It is certified that error appears in the above-identified patent and that said Letters Patent is hereby corrected as shown below:

In the Specification

Column 4, Line 65, "I=supplied to an" should be -- $I_{REF}$ supplied to an --.

Column 5, Line 17, "I=flows between" should be -- $I_{REF}$ flows between --.

Column 7, Line 39, "current, $\beta I_c$ (=$I_{c1}$-" should be -- current, $\Delta I_c$ (=$I_{c1}$ - --.

Column 11, Line 14, "current 111 supplied" should be -- current $I_{REF1}$ supplied --.

Signed and Sealed this
Second Day of August, 2022

Katherine Kelly Vidal
*Director of the United States Patent and Trademark Office*